US008948908B2

(12) United States Patent  (10) Patent No.: US 8,948,908 B2
Nomura  (45) Date of Patent: Feb. 3, 2015

(54) AUTOMATED WAREHOUSE AND ARTICLE REMOVAL METHOD

(75) Inventor: Misaki Nomura, Toyohashi (JP)

(73) Assignee: Murata Machinery, Ltd., Kyoto (JP)

( * ) Notice: Subject to any disclaimer, the term of this patent is extended or adjusted under 35 U.S.C. 154(b) by 101 days.

(21) Appl. No.: 13/819,561

(22) PCT Filed: Jul. 25, 2011

(86) PCT No.: PCT/JP2011/004162
§ 371 (c)(1),
(2), (4) Date: Feb. 27, 2013

(87) PCT Pub. No.: WO2012/035693
PCT Pub. Date: Mar. 22, 2012

(65) Prior Publication Data
US 2013/0158701 A1  Jun. 20, 2013

(30) Foreign Application Priority Data
Sep. 13, 2010  (JP) .................................. 2010-204795

(51) Int. Cl.
*G06F 7/00* (2006.01)
*B65G 1/137* (2006.01)
(Continued)

(52) U.S. Cl.
CPC .......... *B65G 1/137* (2013.01); *H01L 21/67766* (2013.01); *H01L 21/67772* (2013.01); *H01L 21/67359* (2013.01); *H01L 21/67769* (2013.01)
USPC .......................... 700/214; 414/267; 211/41.18

(58) Field of Classification Search
CPC . G11B 17/225; G11B 15/689; G11B 15/6835
USPC .............................................. 700/214
See application file for complete search history.

(56) References Cited

U.S. PATENT DOCUMENTS 7,731,470 B2  6/2010  Yamamoto ............... 414/331.05
2006/0222479 A1*  10/2006  Shiwaku et al. ............. 414/267
(Continued)

FOREIGN PATENT DOCUMENTS

JP  62-217036  9/1987
JP  63-127906  5/1988
(Continued)

OTHER PUBLICATIONS

English translation of International preliminary report on patentability dated Apr. 9, 2013 issued in corresponding PCT application PCT/JP2011/004162.
(Continued)

*Primary Examiner* — Gene Crawford
*Assistant Examiner* — Kyle Logan
(74) *Attorney, Agent, or Firm* — DLA Piper LLP (US)

(57) ABSTRACT

A clean stocker includes: a reticle rotatable rack separately storing reticles and a pod; an empty pod rotatable rack; a manual load port supplying to an operator a pod including a reticle; a pod-with-reticle rotatable rack temporarily storing the pod including the reticle; a detecting unit detecting an instruction sent from the operator; a pod opener for, when a first instruction is detected, obtaining (i) a reticle from the reticle rotatable rack and (ii) an empty pod from the empty pod rotatable rack, and placing the obtained reticle into the empty pod; and a pod transporting apparatus (i) putting on the pod-with-reticle rotatable rack the pod including the reticle, and (ii) when a second instruction is detected, transporting the pod including the reticle from the pod-with-reticle rotatable rack to the manual load port.

4 Claims, 9 Drawing Sheets

(51) Int. Cl.
*H01L 21/677* (2006.01)
*H01L 21/673* (2006.01)

(56) References Cited

U.S. PATENT DOCUMENTS

2008/0023417 A1\* 1/2008 Yamamoto ................. 211/41.18
2008/0046108 A1   2/2008 Rebstock

FOREIGN PATENT DOCUMENTS

| JP | 63-267601  | 11/1988 |
| JP | 04-094306  | 3/1992  |
| JP | 2008-030914 | 2/2008  |

OTHER PUBLICATIONS

Extended European search report dated Sep. 1, 2014 issued in corresponding European application 11824713.9.

\* cited by examiner

AUTOMATED WAREHOUSE AND ARTICLE REMOVAL METHOD

CROSS REFERENCE TO RELATED APPLICATIONS

This application is a national stage of international application PCT/JP2011/004162, filed on Jul. 25, 2011, and claims the benefit of priority under 35 USC 119 of Japanese application 2010-204795, filed on Sep. 13, 2010, which are incorporated herein by reference.

TECHNICAL FIELD

The present invention relates to automated warehouses and, in particular, to an automated warehouse which separately stores an article and a case, and, upon receiving an instruction to take out the article, places the article into the case and take the case out.

BACKGROUND ART

Reticles have been used for manufacturing electronic parts. Such reticles are stored in a clean stocker placed in a clean room (See PTL 1, for example). The clean stocker separately stores the reticles and pods for placing the reticles. Upon receiving an instruction to take out a reticle, the clean stocker places the reticle into a pod, and takes the pod out to a load port.

Here, placing the reticle into the pod requires some amount of time. Hence, through an external terminal placed in an operator's room which is separated from the clean room, an operator gives an instruction to the clean stocker to take out a specific reticle. Then, while the clean stocker is placing the specified reticle into the pod and taking out the pod to the load port, the operator travels to the place where the clean stocker is placed.

CITATION LIST

Patent Literature

[PTL 1]
Japanese Unexamined Patent Application Publication No. 2008-30914

SUMMARY OF INVENTION

Technical Problem

In the case where it takes excessively much time between when the operator sends the instruction to take out a reticle and when the operator actually obtains the reticle, the above clean stocker could cause the problems below.

Suppose operators A and B operate the external terminal to send instructions to take out reticles, and then the operator B arrives at the site where the clean stocker is placed, followed by the operator A. Here, the load port has kept a pod including a reticle which the operator A should receive. Hence the operator B has to wait for the coming of the operator A.

Furthermore, suppose the load port in the clean stocker works as a receiving port as well as a take-out port. In the case where a pod includes a reticle to be taken out and is left for a long time to the load port, such a left pod could prevent another pod including a reticle from being brought in.

In either case, a pod that has already been taken out and includes a reticle occupies the load port. Consequently such a pod inevitably keeps another pod, including an essentially-needed reticle, waiting to be brought in and taken out.

The present invention is conceived in view of the above problems and aims to achieve an object to provide an automated warehouse which can smoothly bring in and take out an article.

Solution to Problem

An automated warehouse according to an aspect of the present invention includes: a storage rack which separately stores articles and a case for containing at least one of the articles; a load port which supplies to an operator the at least one article contained in the case; a temporary storage rack which temporarily stores the at least one article contained in the case until the at least one article is transported to the load port; a detecting unit which detects an instruction sent from the operator; a placing apparatus which, when the detecting unit detects a first instruction indicating that a predetermined one of the articles is to be taken out, (i) obtains the predetermined article and a case from the storage rack, and (ii) places the obtained predetermined article in the case; and a transporting apparatus which (i) puts, on the temporary storage rack, the predetermined article placed in the case by the placing apparatus, and, (ii) when the detecting unit detects a second instruction indicating that the predetermined article is actually ready to be taken out, transports the predetermined article placed in the case from the temporary storage rack to the load port.

The above structure makes it possible to prevent a load port from being occupied by an article to be taken out between when the operator sends an instruction to take out an article (providing a first instruction) and when he or she actually receives the article (providing a second instruction). Such a feature makes it possible to smoothly bring in and take out an article.

The automated warehouse may include an input unit which receives the second instruction from the operator. When the detecting unit detects the second instruction that is inputted to the input unit by the operator, the transporting apparatus may transport the predetermined article placed in the case from the temporary storage rack to the load port.

Since the second instruction is inputted from the input unit provided to the automated warehouse, the article can be picked up as soon as the second instruction is inputted. It is noted that the input unit may be, for example, an operating panel attached to a wall of the automated warehouse, or a terminal placed near the automated warehouse. Furthermore, the input unit does not have to be limited to the one for the operator actively inputting the second instruction; instead, the input unit may be a sensor which detects the operator coming near the automated warehouse.

The temporal storage rack may store the articles each contained in one of cases including the case. The second instruction may include information for specifying an article to be taken out among the articles that are temporarily stored on the temporary storage rack. The transporting apparatus may transport, from the temporary storage rack to the load port, the article specified by the second instruction detected by the detecting unit. Hence even though two or more first instructions are inputted and the second instruction is inputted in an order which is different from the order of the first instructions, the above feature makes it possible to smoothly take out the articles.

The automated warehouse may include an external terminal which is provided at a distant place and connected to the automated warehouse via a communications network. The external terminal may be used by the operator for inputting the first instruction. When the detecting unit detects the first instruction inputted to the external terminal, the placing apparatus may put, on the temporary storage rack, the predetermined article contained in the case.

According to the above feature, the temporary storage rack may be used only when the first instruction is inputted from the external terminal that is provided at a distant place. In contrast, when an article is taken out based on a predetermined schedule, or when the operator comes to the site where the automated warehouse is placed and gives an instruction to take out the article, the article may directly be taken out from the placing apparatus to the load port.

It is noted that the "distant place" in the Specification is so far from the site where the external terminal is placed to the automated warehouse that it takes much time (such as ten minutes) for the operator to arrive at the automated warehouse and that the above problems occur. A typical distant place may be a room or a building which is different from the room where the automated warehouse is placed. Even though the automated warehouse and the external terminal are placed in the same room, they are considered distantly apart from each other when, in an extremely large factory for example, the external terminal is placed near an entrance and the automated warehouse is placed at the most distant location from the entrance.

An article take-out method according to an aspect of the present invention is used for an automated warehouse which (i) includes: a storage rack that separately stores articles and a case for containing at least one of the articles; a load port that supplies to an operator the at least one article contained in the case; a temporary storage rack that temporarily stores the at least one article contained in the case until the at least one article is transported to the load port; and a detecting unit that detects an instruction sent from the operator, and (ii) places the at least one article in the case and takes out the at least one article. Specifically, the article take-out method includes: when the detecting unit detects a first instruction indicating that a predetermined one of the articles is to be taken out, (i) obtaining the predetermined article and the case, (ii) placing the obtained predetermined article in the case, and (iii) putting, on the temporary storage rack, the predetermined article placed in the case; and, when the detecting unit detects a second instruction indicating that the predetermined article is actually ready to be taken out, transporting the predetermined article placed in the case from the temporary storage rack to the load port.

Advantageous Effects of Invention

Between the operator's sending an order to take out an article (providing a first instruction) and his or her actually receiving the article (providing a second instruction), the present invention can prevent a load port from being occupied by an article to be taken out. Such a feature makes it possible to smoothly bring in and take out an article.

DESCRIPTION OF EMBODIMENT

An embodiment of the present invention shall be described hereinafter with reference to the drawings.

Figure 1:
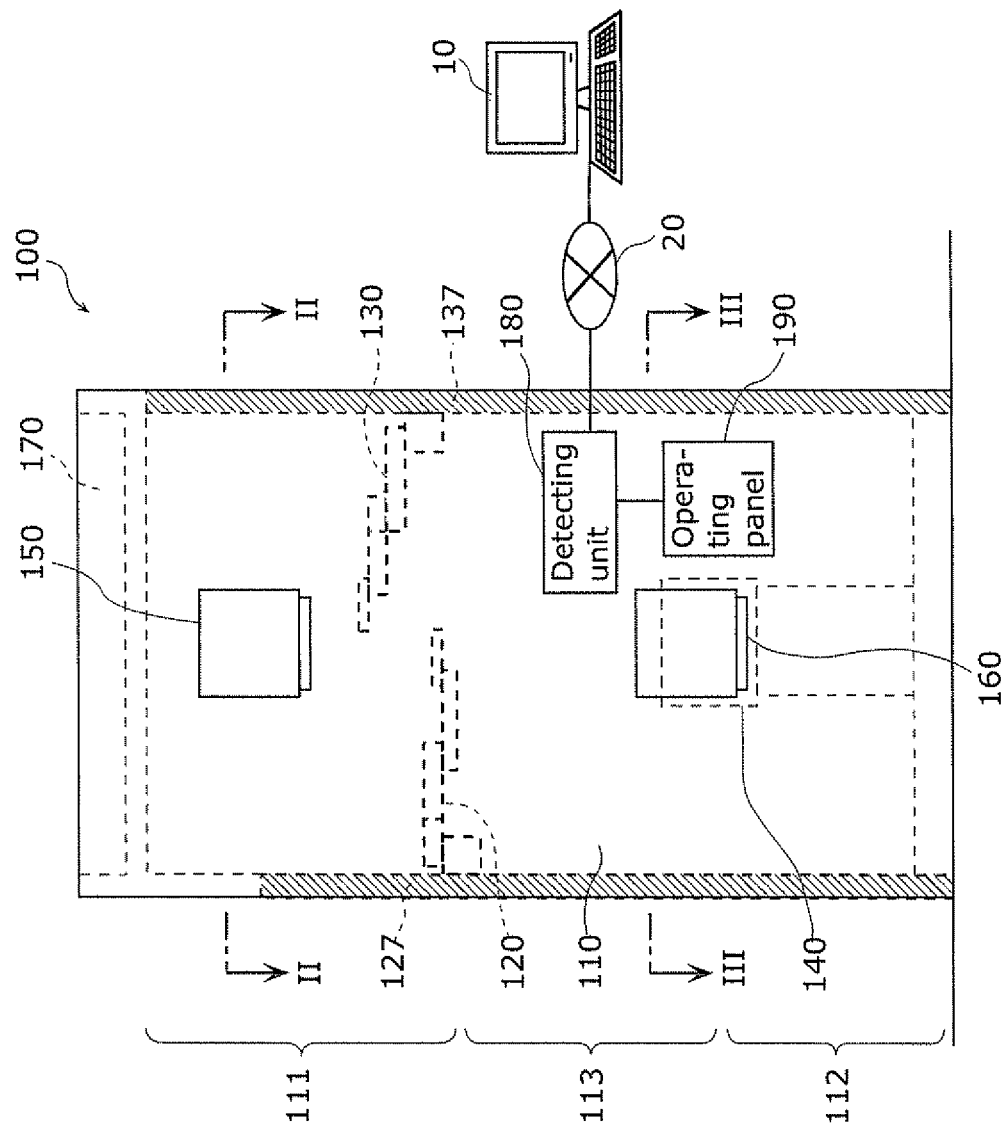
FIG. 1 depicts an elevation view of a clean stocker according to an embodiment.
Figure 2:
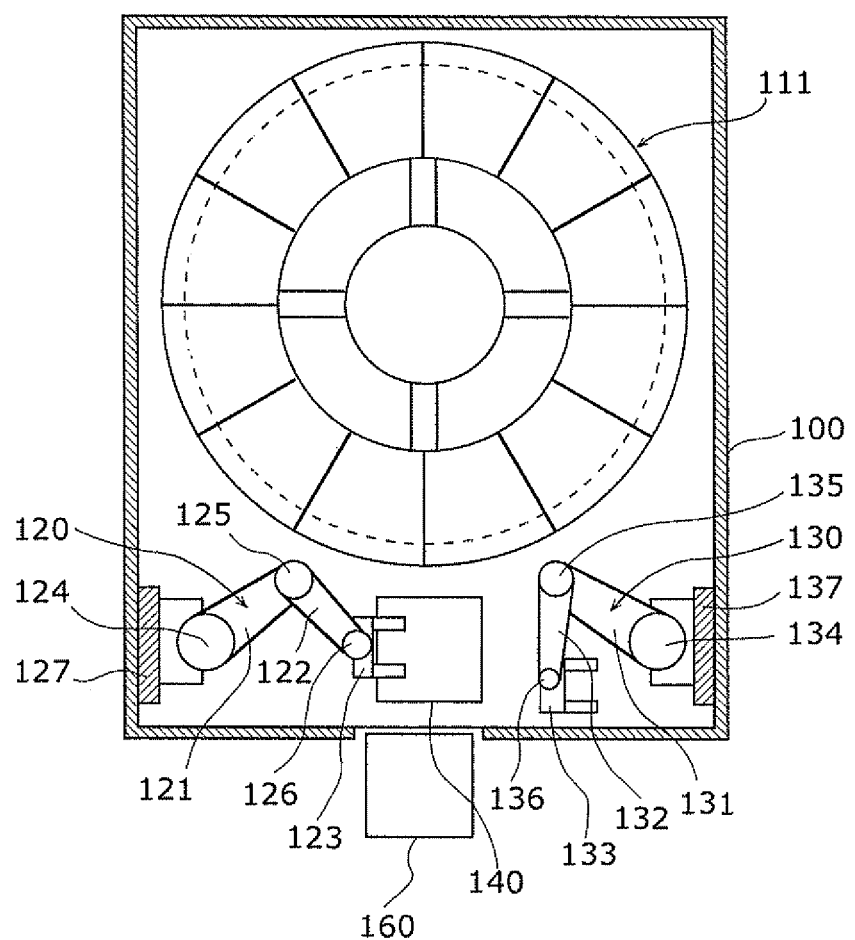
FIG. 2 depicts a cross-sectional view taken from a line II-II of FIG. 1.
Figure 3:
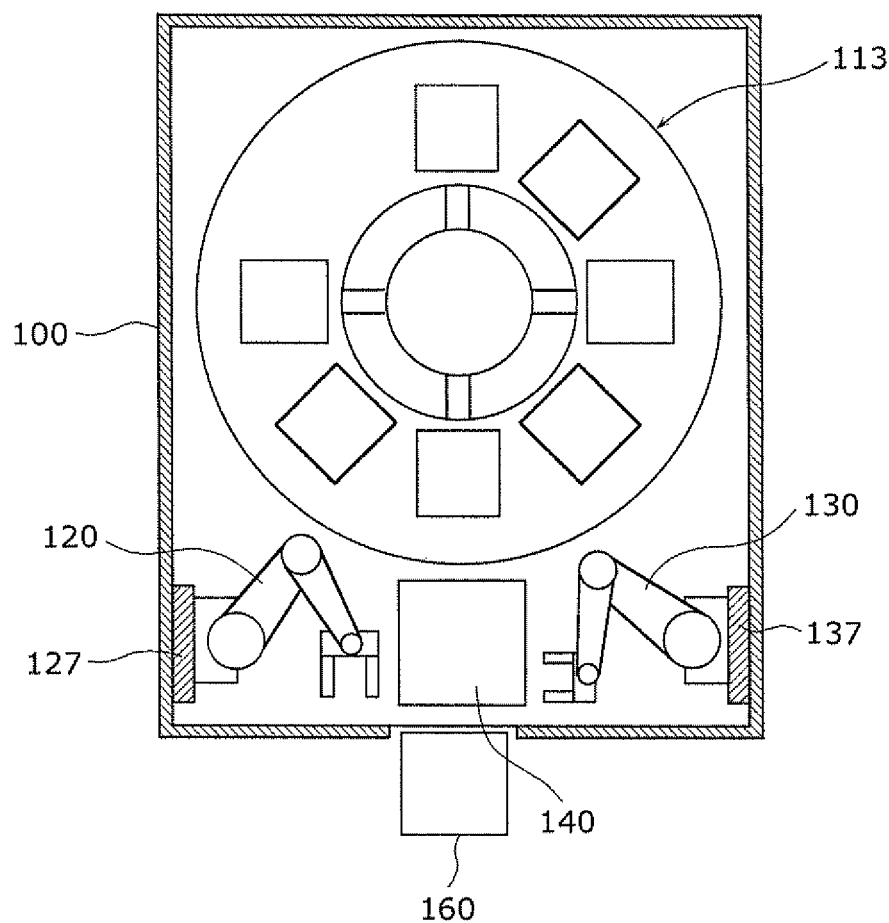
FIG. 3 depicts a cross-sectional view taken from a line III-III of FIG. 1.

Described first, with reference to FIGS. 1 to 3, is a clean stocker 100 which is an automated warehouse according to the embodiment of the present invention. It is noted that FIG. 1 depicts an elevation view of the clean stocker 100 according to the embodiment. FIG. 2 depicts a cross-sectional view taken from a line II-II of FIG. 1. FIG. 3 depicts a cross-sectional view taken from a line III-III of FIG. 1.

The clean stocker 100 is installed in a clean room of a semiconductor factory or a liquid crystal display factory, and separately stores reticles (articles) for exposure for either a semiconductor or a liquid crystal substrate, and pods (cases) for containing the reticles.

Specifically, the clean stocker 100 mainly includes a rotatable rack set 110, a reticle transporting apparatus 120, a pod transporting apparatus 130, a pod opener 140, an automatic load port 150, a manual load port 160, a clean gas supplying unit 170, a detecting unit 180, and an operating panel 190. Furthermore, the rotatable rack set 110 includes vertical multiple stages, and is separated into a reticle rotatable rack 111, an empty pod rotatable rack 112, and a pod-with-reticle rotatable rack 113. It is noted that the positional relationship among the reticle rotatable rack 111, the empty pod rotatable rack 112, and the pod-with-reticle rotatable rack 113 shall not be defined in particular. As shown in FIG. 1, for example, a preferable arrangement of the racks may be the following: The reticle rotatable rack 111, which requires clean atmosphere, is placed in an upper stage that is close to the clean gas supplying unit 170; the pod-with-reticle rotatable rack 113 is placed in a middle stage; and the empty pod rotatable rack 112 is placed in a lower stage.

The reticle rotatable rack 111 stores semiconductor reticles or liquid crystal substrate reticles for exposure. The empty pod rotatable rack 112 stores an empty pod containing no reticle (hereinafter referred to as "empty pod"). The pod-with-reticle rotatable rack 113 stores a pod containing a reticle (hereinafter referred to as "pod-with-reticle"). In other words, the pod-with-reticle rotatable rack 113 temporarily stores a reticle contained in a pod.

It is noted that each of the reticle rotatable rack 111 and the empty pod rotatable rack 112 works as a storage rack for separately storing a reticle and a pod. In contrast, the pod-with-reticle rotatable rack 113 works as a temporary storage rack for temporarily storing a pod-with-reticle.

It is noted that empty pods to be stored on the empty pod rotatable rack 112 may be fewer than reticles to be stored on the reticle rotatable rack 111. For example, approximately one tenth to one hundredth as many empty pods as reticles may be stored. Moreover, pods-with-reticle to be stored on the pod-with-reticle rotatable rack 113 may even be fewer than empty pods to be stored on the empty pod rotatable rack 112. The pod-with-reticle rotatable rack 113 may store at least one pod-with-reticle.

The reticle rotatable rack 111, the empty pod rotatable rack 112, and the pod-with-reticle rotatable rack 113 may rotate at once. Each of the stages does not have to separately rotate with each other. In order to bring in and take out an article faster, each of the racks may further be separated into an upper block and a lower block, and each block may rotate separately.

The reticle transporting apparatus 120 is mounted on one side in the front of the clean stocker 100 (in FIG. 1, on the left). The reticle transporting apparatus 120 transports reticles between the reticle rotatable rack 111 and the pod opener 140.

More specifically, the reticle transporting apparatus 120 has two arms 121 and 122 connected to each other, a hand 123 attached to an end of the arm 122, and three joints 124, 125, and 126 which operate in a horizontal plane. Furthermore, the reticle transporting apparatus 120 vertically travels along an elevator guide 127. In other words, the reticle transporting apparatus 120 vertically travels within the length of the elevator guide 127, and causes each of the joints 124, 125, and 126 to independently operate. Such features allow the reticle transporting apparatus 120 to transport a reticle in any given instruction within the reach of the two arms 121 and 122.

The pod transporting apparatus 130 is mounted on the other side in the front of the clean stocker 100 (in FIG. 1, on the right). The pod transporting apparatus 130 transports an empty pod between the empty pod rotatable rack 112 and the pod opener 140. The pod transporting apparatus 130 also transports a pod-with-reticle between (i) the pod opener 140 and the automatic load port 150, (ii) the pod opener 140 and the manual load port 160, (iii) the pod opener 140 and the pod-with-reticle rotatable rack 113, and (iv) the pod-with-reticle rotatable rack 113 and the manual load port 160.

More specifically, the pod transporting apparatus 130 has two arms 131 and 132 connected to each other, a hand 133 attached to an end of the arm 132, and three joints 134, 135, and 136 which operate in a horizontal plane. Furthermore, the pod transporting apparatus 130 vertically travels along an elevator guide 137. In other words, the pod transporting apparatus 130 vertically travels within the length of the elevator guide 137, and causes each of the joints 134, 135, and 136 to independently operate. Such features allow the pod transporting apparatus 130 to transport a pod in any given instruction within the reach of the two arms 131 and 132.

The pod opener 140 is provided in the front and middle of the clean stocker 100; that is, between the reticle transporting apparatus 120 and the pod transporting apparatus 130. The pod opener 140 works as a placing apparatus to place a reticle into an empty pod, and a take-out apparatus to take out the reticle out of a pod-with-reticle. The details of the pod opener 140 shall be described later.

The automatic load port 150, which is a load port for an overhead vehicle, is mounted in front and upper part of the clean stocker 100. The automatic load port 150 is an interface for bringing in and taking out a pod-with-reticle between a not-shown overhead vehicle and the clean stocker 100. The manual load port 160, which is a load port for an operator, is mounted in front and lower part of the clean stocker 100. The manual load port 160 is an interface for bringing in and taking out a pod-with-reticle between the operator and the clean stocker 100.

The clean gas supplying unit 170 is provided in the clean stocker 100 on the ceiling, and, for example, supplies clean gas, such as clean air and nitrogen, as downflow. The clean gas supplying unit 170 may include a producing unit for producing clean gas and a fan filter unit. The clean gas supplying unit 170 may also take clean air from the ceiling of the clean room, and supply the air to the clean stocker 100.

It is noted that, in the clean stocker 100, clean gas from the clean gas supplying unit 170 is supplied first to the reticle rotatable rack 111, followed by to the pod-with-reticle rotatable rack 113 and to the empty pod rotatable rack 112. Hence, the clean gas supplying unit 170 can provide a clean atmosphere to, in particular, the reticle rotatable rack 111 that stores bare reticles, and prevent reticles from being contaminated.

The detecting unit 180 detects an instruction inputted by the operator via the operating panel 190 and an after-described operating terminal 10. Specifically, the detecting unit 180 detects a first instruction and a second instruction inputted by the operator. Then the detecting unit 180 gives the detected first and second instructions to the rotatable rack set 110, the reticle transporting apparatus 120, the pod transporting apparatus 130, and the pod opener 140. The operation of each structural element which has received the instructions will be described later.

It is noted that the first instruction is given for taking out a predetermined one of reticles stored on the reticle rotatable rack 111. In other words, the first instruction includes information which specifies a reticle stored on the reticle rotatable rack 111. Moreover, the operator may input the first instruction on either the operating panel 190 or the after-described operating terminal 10.

In contrast, the second instruction indicates that a pod-with-reticle, which has been temporarily stored on the pod-with-reticle rotatable rack 113, is actually ready to be taken out. In other words, the second instruction includes information which specifies a pod-with-reticle stored on the pod-with-reticle rotatable rack 113. Moreover, the operator may input the second instruction only on the operating panel 190.

The operating panel 190 is attached, for example, to an outer wall in the front of the clean stocker 100, and works as an input unit which receives an instruction from the operator. It is noted that the operating panel 190 may adopt any form which can receive an instruction from the operator. For example, the operating panel 190 may be a touch panel, a keyboard, a push-button, and a switch.

Furthermore, the operating terminal (external terminal) 10 for the operator to operate is connected to the clean stocker 100 via a communications network 20. Normally, the operating terminal 10 is provided out of the clean room—that is provided in the operators room—where the clean stocker 100 is installed. Then, through the operating terminal 10, the operator can remotely control the clean stocker 10.

Figure 4:
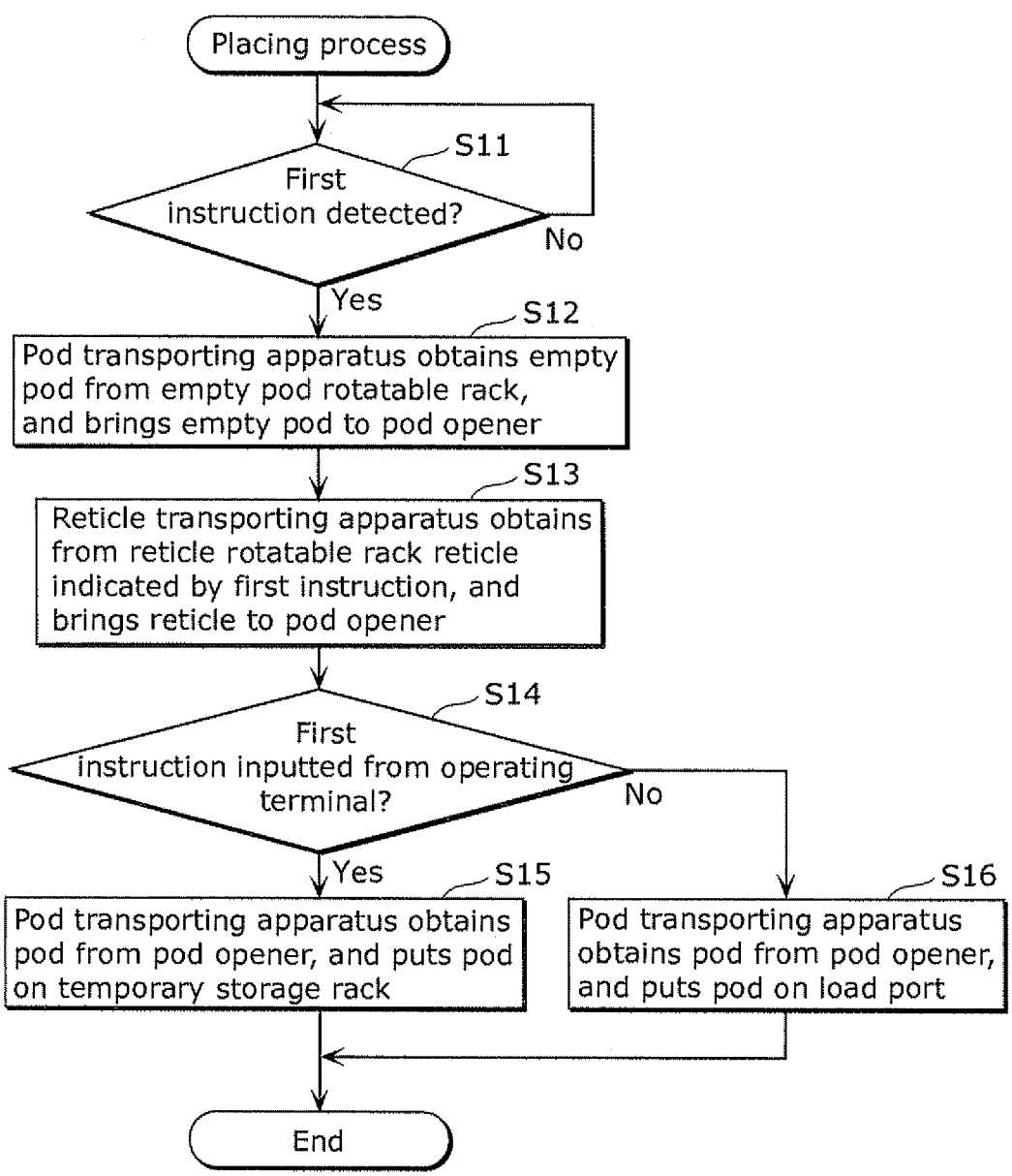
FIG. 4 depicts a flowchart showing a placing process when a first instruction is detected.
Figure 5:
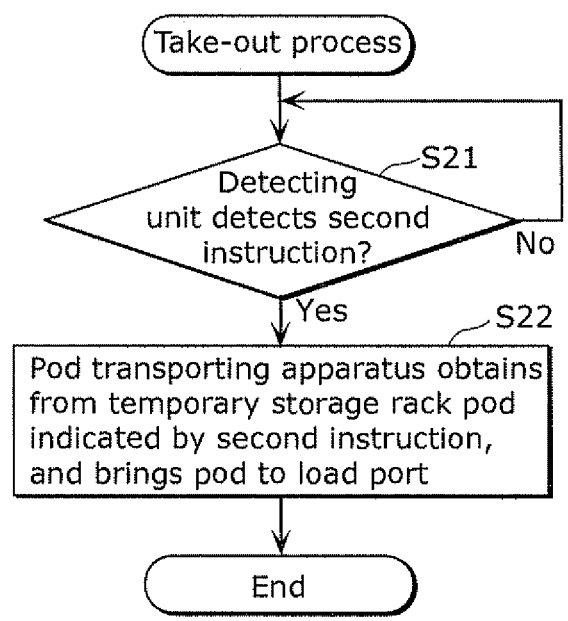
FIG. 5 depicts a flowchart showing a take-out process when a second instruction is detected.

Described next are processes when the first and second instructions are detected, with reference to FIGS. 4 to 9. FIG. 4 depicts a flowchart showing a placing process when the first instruction is detected. FIG. 5 depicts a flowchart showing a take-out process when a second instruction is detected. FIGS. 6 to 9 show the pod opener 140 in the placing process.

First, as shown in FIG. 4, the detecting unit 180 in the placing process monitors when the operator inputs the first instruction (S11). Then, upon detecting the first instruction (S11: Yes), the detecting unit 180 gives the first instruction to the rotatable rack set 110, the reticle transporting apparatus 120, the pod transporting apparatus 130, and the pod opener 140.

Figure 6:
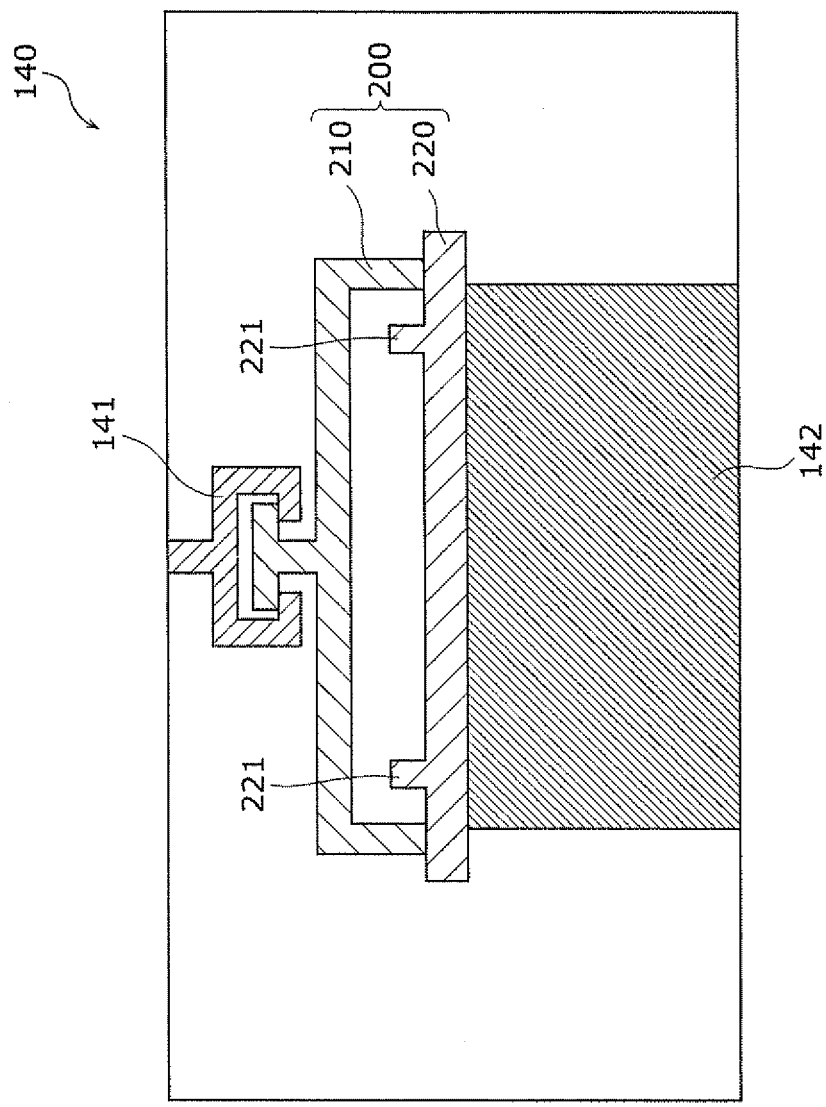
FIG. 6 shows a pod opener immediately after an empty pod is brought thereinto.
Figure 7:
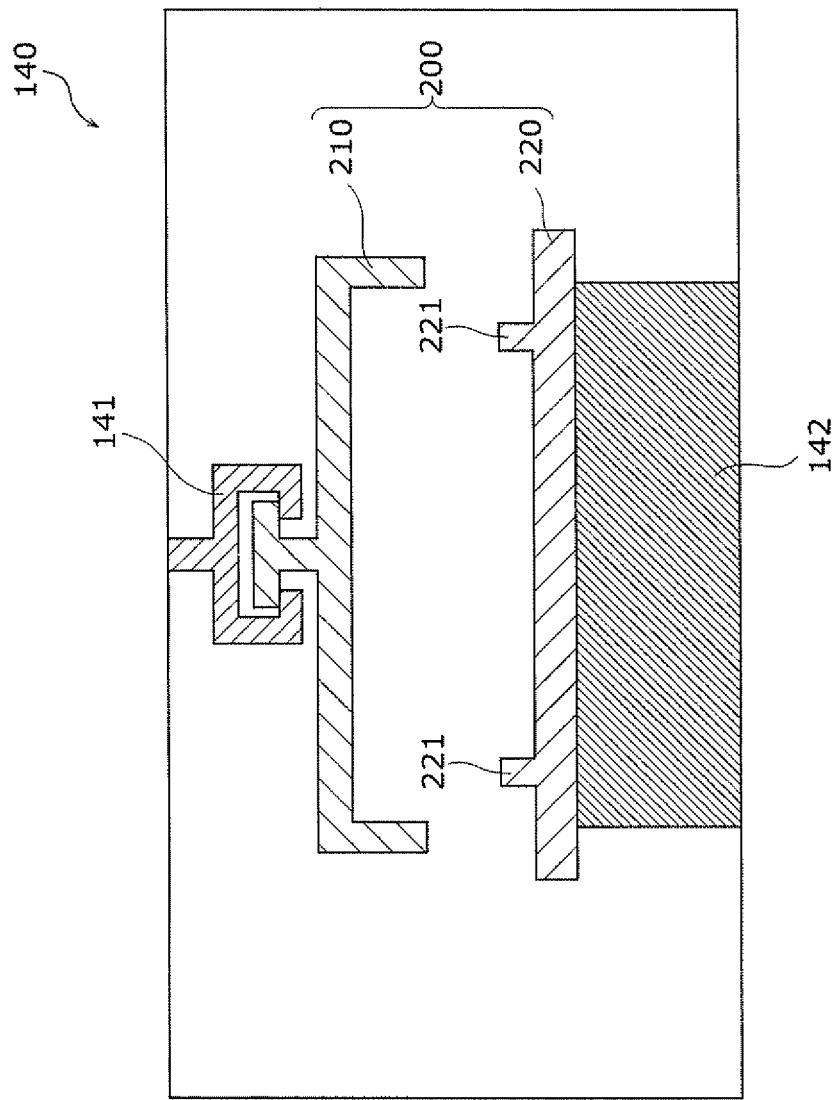
FIG. 7 shows that the pod opener is ready to receive a reticle.

Next, upon receiving the first instruction, the pod transporting apparatus 130 obtains an empty pod from the empty pod rotatable rack 112, and brings the empty pod to the pod opener 140 (S12). Here the empty pod rotatable rack 112, which has received the first instruction, rotates so that the pod transporting apparatus 130 can obtain the empty pod. FIG. 6 shows the pod opener 140 immediately after an empty pod 200 is brought thereinto. FIG. 7 shows that the pod opener 140 is ready to receive a reticle.

First, as shown in FIG. 6, the pod 200 includes a cover 210 and a door 220 which are vertically separatable from each other. It is noted that FIG. 6 exemplifies the pod 200 capable of storing one reticle. As a matter of course, the pod 200 may store multiple reticles.

Moreover, on the top surface of the door 220, multiple protrusions 221 are provided to support the reticle. The pod opener 140 includes a locking part 141 to lock the cover 210, and a platform 142 to keep the door 220 thereon. Then, the pod transporting apparatus 130 stores the pod 200 in the pod opener 140 so that the cover is locked onto the locking part 141 and the door 220 is kept on the platform 142.

It is noted that the platform 142 works as an elevator which vertically travels with the door 220 kept thereon. Then, when the platform 142 descends with the door 220 kept thereon, the cover 210 and the door 220 vertically separate from each other as shown in FIG. 7, and the pod 200 is ready to store a reticle.

Figure 8:
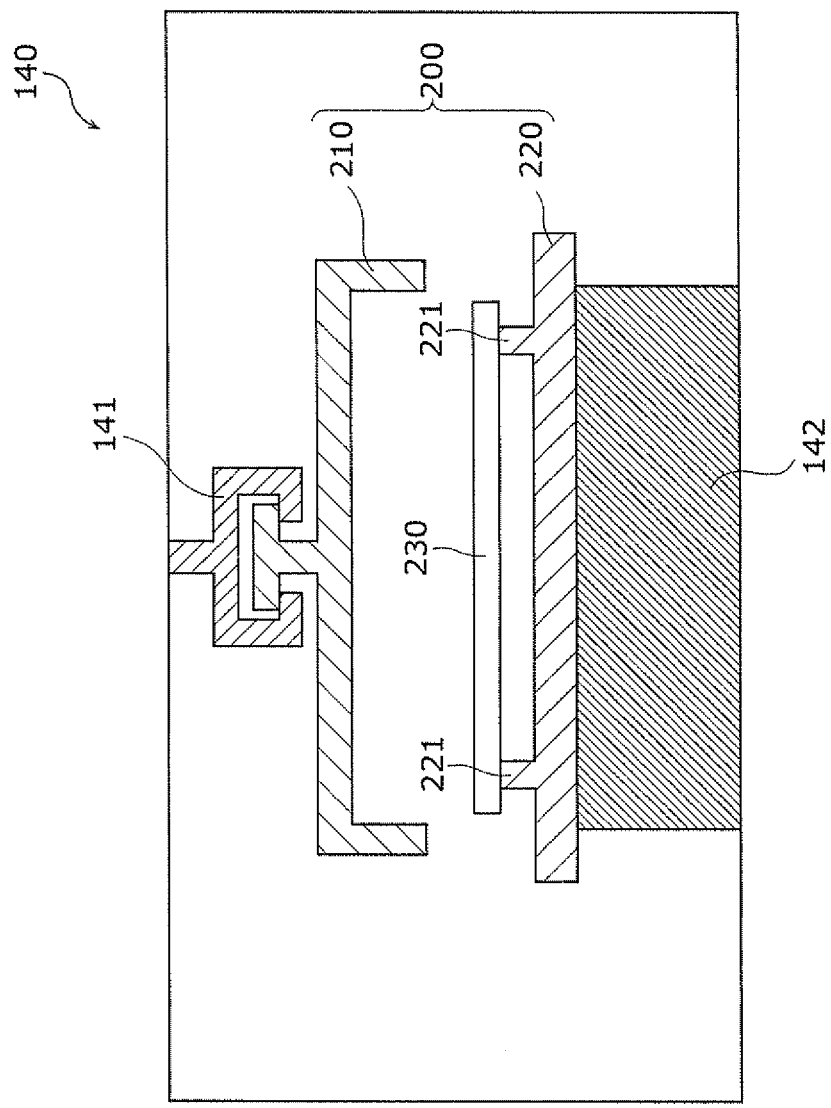
FIG. 8 shows the pod opener immediately after receiving the reticle.
Figure 9:
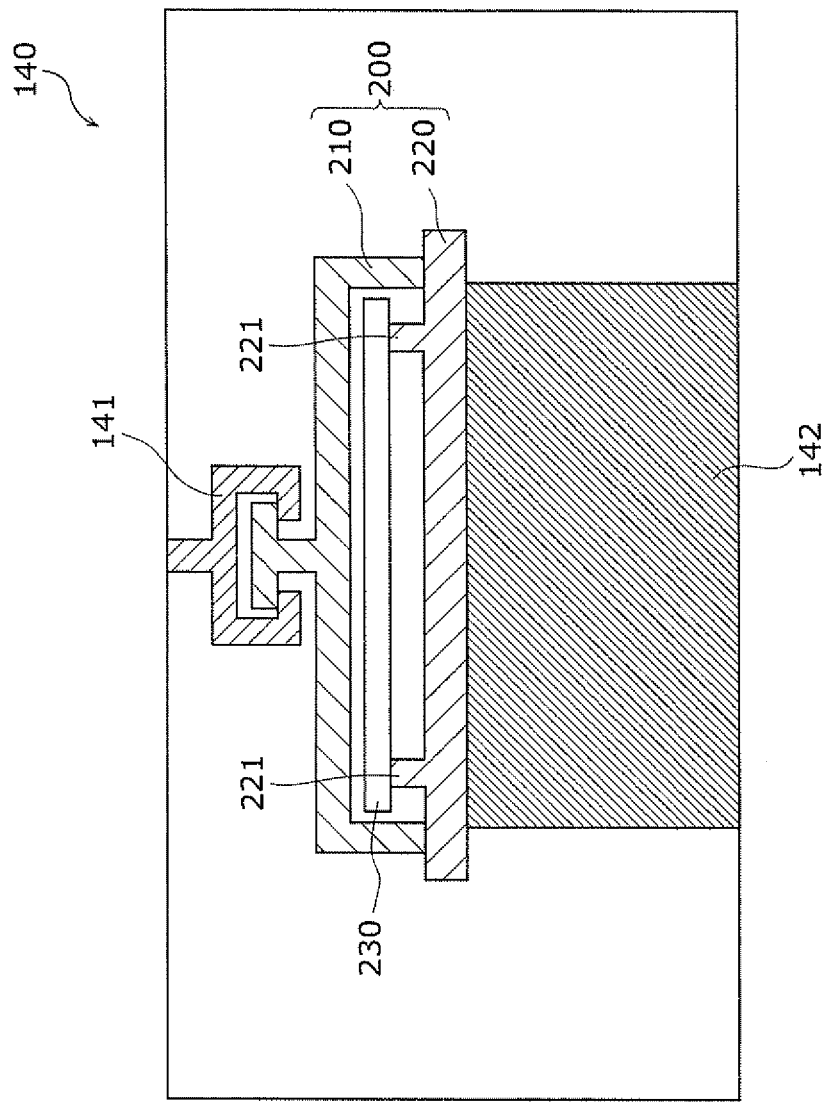
FIG. 9 shows the reticle placed into the pod.

Next, upon receiving the first instruction, the reticle transporting apparatus 120 obtains from the reticle rotatable rack 111 a reticle indicated by the first instruction, and brings the obtained reticle in the pod opener 140 (S13). Here the reticle rotatable rack 111 which has received the first instruction rotates so that the reticle transporting apparatus 120 can obtain the reticle indicated by the first instruction. FIG. 8 shows the pod opener 140 immediately after receiving a reticle 230. FIG. 9 shows the reticle 230 placed into the pod 200.

As shown in FIG. 8, the reticle transporting apparatus 120 puts the reticle 230 on the protrusions 221 which protrude from the top surface of the door 220. Then the table 142 elevates with the door 220 kept thereon, and the reticle 230 is placed in the pod 200.

Next, the pod transporting apparatus 130 determines whether or not the first instruction detected by the detecting unit 180 is inputted from the operating terminal 10 (S14). Then, in the case where the first instruction is inputted through the operating terminal 10 (S14: Yes), the pod transporting apparatus 130 puts the pod-with-reticle, which is placed in the pod opener 140, on the pod-with-reticle rotatable rack 113 (S15). Here, upon receiving the first instruction, the pod-with-reticle rotatable rack 113 rotates so that the pod transporting apparatus 130 can put the pod-with-reticle on the pod-with-reticle rotatable rack 113.

In contrast, in the case where the first instruction is not inputted through the operating terminal 10 (S14: No), the pod transporting apparatus 130 directly puts the pod-with-reticle, which is placed in the pod opener 140, on either the automatic load port 150 or the manual load port 160 (S16). In other words, the pod-with-reticle is not temporarily stored on the pod-with-reticle rotatable rack 113.

Specifically, the above steps can be carried out when an overhead vehicle obtains a pod-with-reticle at the automatic load port 150 according to a predetermined schedule, or when the operator inputs the first instruction through the operating panel 190 provided on the clean stocker 100. In such cases, the pod-with-reticle placed on either the automatic load port 150 or the manual load port 160 is picked up immediately. Hence the pod-with-reticle does not have to be temporarily stored on the pod-with-reticle rotatable rack 113.

Then, as shown in FIG. 5, the detecting unit 180 in the take-out process monitors when the operator inputs the second instruction (S21). Upon detecting the second instruction (Yes: S21), the detecting unit 180 gives the second instruction to the rotatable rack set 110 and the pod transporting apparatus 130.

Hence, upon receiving the second instruction, the pod transporting apparatus 130 obtains from the pod-with-reticle rotatable rack 113 a pod-with-reticle indicated by the second instruction, and puts the indicated pod on the manual load port 160 (S22). Here, upon receiving the second instruction, the pod-with-reticle rotatable rack 113 rotates so that the pod transporting apparatus 130 can put the pod-with-reticle on the pod-with-reticle rotatable rack 113.

The clean stocker 100 structured above can smoothly bring in and take out a pod-with-reticle. For example, the above clean stocker 100 achieves particularly advantageous effects under the cases below.

The first exemplary case is that, during the time period between when the operator A inputs the first instruction and when the operator A inputs the second instruction, the operator B is about to bring a pod-with-reticle in the clean stocker 100. Here, according to the first instruction from the operator A, the clean stocker 100 places a predetermined reticle into a pod, and temporarily stores the pod on the pod-with-reticle rotatable rack 113. Then the clean stocker 100 causes the pod opener 140 to separate another pod-with-reticle, which is brought to the manual load port 160, into a reticle and an empty pod, and stores the reticle on the reticle rotatable rack 111 and the empty pod on the empty pod rotatable rack 112. Then, according to the second instruction from the operator A, the clean stocker 100 transports the pod-with-reticle from the pod-with-reticle rotatable rack 113 to the manual load port 160.

Hence, even though it takes excessively much time between when the operator A sends an instruction (inputs the first instruction) to take out a reticle and when the operator A actually comes (inputs the second instruction) to obtain a pot with the reticle, the clean stocker 100 does not prevent the other operator B from storing a pod-with-reticle. Here, the pod-with-reticle rotatable rack 113 may store at least one pod-with-reticle.

The second exemplary case is that the operator A and then the operator B operate the operating terminal 10, and then the operator B arrives at the site where the clean stocker 100 is placed, followed by the operator A. Here, according to the first instructions from the operators A and B, the clean stocker 100 temporarily stores pods-with-reticle on the pod-with-reticle rotatable rack 113. Then, according to the second instruction from the operator B, the clean stocker 100 transports a pod-with-reticle, which the operator B should receive, from the pod-with-reticle rotatable rack 113 to the manual load port 160. Then, according to the second instruction from the operator A, the clean stocker 100 transports another pod-with-reticle, which the operator A should receive, from the pod-with-reticle rotatable rack 113 to the manual load port 160.

Hence, when multiple operators A and B are about to take out the reticles, the clean stocker 100 can smoothly take out the reticles even though the input order is reversed between the first and second instructions. Here the pod-with-reticle rotatable rack 113 needs to store multiple pods-with-reticle (as many pods-with-reticle as the operators or more).

It is noted that, in the above embodiment, the feature of each constituent element shall not be defined as it is. For example, the pod-with-reticle rotatable rack 113 as a temporary storage rack does not have to be a rotatable one and may be a fixed one since there are not so many pods to be stored. Here, for example, the temporary storage rack may be provided in the space between the automatic load port 150 and the manual load port 160, or under the pod opener 140.

The operating panel 190 does not have to be attached to the outer wall in the front of the clean stocker 100. Instead, the operating panel 190 may be placed at a position where the operator can immediately obtain a pod-with-reticle after he or she inputs an instruction, such as a position near the clean stocker 100.

Furthermore, the input unit does not have to be limited to the operating panel 190 that receives an active instruction from the operator. Instead, the input unit may be a sensor which detects the arrival of the operator. More specifically, the first instruction may further include information (operator ID, for example) to specify an operator who has inputted the first instruction, and the input unit may detect that the operator, who has inputted the first instruction, has arrived at the site where the clean stocker 100 is placed (in other words, a pod-with-reticle is ready to be taken out), as soon as the input unit receives the operator ID from an RFID tag which the operator has with him or her.

In addition, the present invention may be applied not only to the clean stocker 100 that stores reticles, but also to any automated warehouse in which an article is placed in a container when the article is taken out.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

INDUSTRIAL APPLICABILITY

The present invention is used with advantage for an automated warehouse in which an article and a container for placing the article are separately stored with each other, and the article is placed in a container when the article is taken out from the warehouse.

REFERENCE SIGNS LIST

10 Operating terminal
20 Communications network
100 Clean stocker
110 Rotatable rack set
111 Reticle rotatable rack
112 Empty pod rotatable rack
113 Pod-with-reticle rotatable rack
120 Reticle transporting apparatus
121, 122, 131, and 132 Arm
123 and 133 Hand
124, 125, 126, 134, 135, and 136 Joint
127 and 137 Elevator guide
130 Pod transporting apparatus
140 Pod opener
141 Locking part
142 Platform
150 Automatic load port
160 Manual load port
170 Clean gas supplying unit
180 Detecting unit
190 Operating panel
200 Pod
210 Cover
220 Door
221 Protrusion
230 Reticle

The invention claimed is:

1. An automated warehouse comprising:
a storage rack which separately stores articles and a case for containing at least one of the articles;
a load port which supplies to an operator the at least one article contained in the case;
a temporary storage rack which temporarily stores the at least one article contained in the case until the at least one article is transported to the load port;
a placing apparatus which, when a first instruction from the operator is detected indicating that a predetermined one of the articles is to be taken out, (i) obtains the predetermined article and a case from the storage rack, and (ii) places the obtained predetermined article in the case; and
a transporting apparatus which (i) puts, on the temporary storage rack, the predetermined article placed in the case by the placing apparatus, and, (ii) when a second instruction from the operator is detected indicating that the predetermined article is actually ready to be taken out, transports the predetermined article placed in the case from the temporary storage rack to the load port, wherein
the temporary storage rack stores the articles each contained in one of cases including the case,
the second instruction includes information for specifying an article to be taken out among the articles that are temporarily stored on the temporary storage rack, and
the transporting apparatus transports, from the temporary storage rack to the load port, the article specified by the second instruction.

2. The automated warehouse according to claim 1, further comprising
an input unit configured to receive the second instruction from the operator,
wherein, when the second instruction that is inputted to the input unit by the operator is detected, the transporting apparatus transports the predetermined article placed in the case from the temporary storage rack to the load port.

3. The automated warehouse according to claim 1, further comprising
an external terminal which is provided at a distant place and connected to the automated warehouse via a communications network, wherein
the external terminal is used by the operator for inputting the first instruction, and
when the first instruction inputted to the external terminal is detected, the placing apparatus puts, on the temporary storage rack, the predetermined article contained in the case.

4. An article take-out method for an automated warehouse which (i) includes: a storage rack that separately stores articles and a case for containing at least one of the articles; a load port that supplies to an operator the at least one article contained in the case; and a temporary storage rack that temporarily stores the at least one article contained in the case until the at least one article is transported to the load port; and (ii) places the at least one article in the case and takes out the at least one article, the article take-out method comprising:
when a first instruction from the operator is detected indicating that a predetermined one of the articles is to be taken out, (i) obtaining the predetermined article and the case, (ii) placing the obtained predetermined article in the case, and (iii) putting, on the temporary storage rack, the predetermined article placed in the case; and when a second instruction from the operator is detected indicating that the predetermined articles is actually ready to be taken out, transporting the predetermined article placed in the case from the temporary storage rack to the load port, wherein the temporary storage rack stores the articles each contained in one of cases including the case, the second instruction includes information for specifying an article to be taken out among the articles that are temporarily stored on the temporary storage rack, and the transporting apparatus transports, from the temporary storage rack to the load port, the article specified by the second instruction.

\* \* \* \* \*